(12) United States Patent  
Morita

(10) Patent No.: US 7,780,505 B2  
(45) Date of Patent: Aug. 24, 2010

(54) SEMICONDUCTOR MANUFACTURING APPARATUS AND SEMICONDUCTOR MANUFACTURING METHOD

(75) Inventor: Tomotake Morita, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 210 days.

(21) Appl. No.: 11/949,094

(22) Filed: Dec. 3, 2007

(65) Prior Publication Data

US 2008/0146124 A1  Jun. 19, 2008

(30) Foreign Application Priority Data

Dec. 13, 2006 (JP) .............................. 2006-336172

(51) Int. Cl.
*B24B 7/22* (2006.01)
(52) U.S. Cl. ...................... 451/289; 451/388; 451/398
(58) Field of Classification Search ................ 451/388, 451/398, 289, 41
See application file for complete search history.

(56) References Cited

U.S. PATENT DOCUMENTS 5,951,833 A * 9/1999 Yamagata .................... 204/198  
7,055,535 B2 * 6/2006 Kunisawa et al. ............ 134/157

FOREIGN PATENT DOCUMENTS

JP        7-302832       11/1995

* cited by examiner

*Primary Examiner*—Robert Rose  
(74) *Attorney, Agent, or Firm*—Young & Thompson

(57) ABSTRACT

A semiconductor manufacturing apparatus includes a supporting unit for supporting a semiconductor wafer received from a CMP apparatus and a vacuuming system for holding the wafer on the supporting unit. The vacuuming is applied only in a peripheral area of the wafer. In the peripheral area of the wafer, any circuit such as interconnections and devices are not manufactured. When the wafer is released by supplying gas to the vacuumed space, even if static electricity occurs, the electronic circuit to be manufactured on the wafer does not harmed, because the static electricity occurs only in the peripheral area where any circuit does not exist.

8 Claims, 7 Drawing Sheets

SEMICONDUCTOR MANUFACTURING APPARATUS AND SEMICONDUCTOR MANUFACTURING METHOD

This application is related to Japanese Patent Application No. 2006-336172. The disclosure of that application is incorporated herein by reference.

BACKGROUND OF THE INVENTION

1. Field of the Invention

The present invention relates to a technique for holding a semiconductor wafer by a vacuum chuck.

2. Description of Related Art

In a manufacturing process of a semiconductor device, a vacuum chuck is used for holding a semiconductor wafer.

FIG. 1 shows a part of a semiconductor manufacturing process using a vacuum chuck. A semiconductor wafer is mounted on a wafer cassette (step S1). A transit mechanism takes out the semiconductor wafer from the wafer cassette, and passes it to a CMP (Chemical Mechanical Polishing) apparatus (step S2). The semiconductor wafer is attached to a polishing head of the CMP apparatus. The semiconductor wafer is polished with a CMP process (step S3). The transit mechanism receives the semiconductor wafer treated with the CMP process, and conveys it to a washing apparatus (step S4). The washing apparatus washes the semiconductor wafer (step S5). The washed and dried semiconductor wafer is returned to the wafer cassette (step S6).

FIG. 2 is an example of the side view of the transit mechanism for conveying the semiconductor wafer in steps S2 and S4. A transit mechanism 107 includes a supporting unit 108, a vacuum system 114, an air supply system 116, and a switching valve 118. An upper surface of the supporting unit 108 is a flat sucking surface 110 for supporting the semiconductor wafer 2 horizontally. Wafer sucking openings 112 are formed on the sucking surface 110. The wafer sucking openings 112 connect to the vacuum system 114 and the air supply system 116 via the switching valve 118.

FIG. 3 shows an example of the arrangement of the wafer sucking openings 112 as the sucking surface is seen from above. The wafer sucking openings 112 are formed in appropriate positions suitable for sucking the semiconductor wafer 2.

At step S2, the semiconductor wafer 2 is taken out from the wafer cassette, and is placed on the sucking surface 110. The vacuum system 114 implements vacuuming for the wafer sucking openings. The semiconductor wafer 2 is held by the vacuum chuck.

The transit mechanism 107 moves the semiconductor wafer 2 held on the sucking surface 110 to the CMP apparatus. The polishing head of the CMP apparatus is lowered or the transit mechanism is lifted and a wafer underside surface 6 contacts to a polishing head. The polishing head sucks the semiconductor wafer 2 in vacuum, and conveys the semiconductor wafer 2 onto the polishing table.

Slurry is supplied and flowed on a rotating polishing pad and the polishing head pushes the surface for manufacturing devices (wafer front surface 4) of the semiconductor wafer 2 to the polishing pad with rotating. After the polishing process of a predetermined amount is completed, the semiconductor wafer 2 is sucked in vacuum and fixed to the polishing head, and released from the polishing pad. The polishing head holding the semiconductor wafer 2 moves to a place over the transit mechanism 107. The polishing head is lowered or the transit mechanism is lifted and the wafer surface 4 of the semiconductor wafer 2 contacts to the sucking surface 110 of the transit mechanism 107. The polishing head releases the semiconductor wafer 2. Similar to step S2, the transit mechanism 107 holds the semiconductor wafer 2 by the vacuum chuck.

When a conveying robot holds the semiconductor wafer 2 and the transit mechanism 107 releases it from the vacuum suction, the semiconductor wafer 2 is passed to the conveying robot. The conveying robot returns the semiconductor wafer 2 to the wafer cassette. When the washing apparatus is installed in the system, the semiconductor wafer 2 is returned to the wafer cassette after conveyed to the washing apparatus to be washed.

Depending on the manufacturing system, the polishing process may be implemented on a plurality of the polishing tables in order to improve process performance of the apparatus. When the polishing is implemented on the plurality of the polishing tables, the semiconductor wafer 2 is returned to the transit mechanism from the polishing head, and is treated by another polishing head via another transit mechanism.

In Japanese Laid-Open Patent Application JP-A-Heisei 07-302832, an example of a vacuum suction apparatus is described. In this Patent Application, a vacuum suction apparatus for preventing working fluid to flow between the vacuum sucking surface and the underside surface of a specimen is disclosed.

SUMMARY

The present inventor has recognized that the transit mechanism as described above may have following problems.

In the transit mechanism, static electricity is generated on the sucking surface 110 depending on a condition. The wafer front surface 4 is damaged due to the static electricity, as a result, a circuit thereof may be a defect. It is required to take some measures for this problem.

In more detail, under a status described below, there is a possibility of causing a problem. When the semiconductor wafer 2 is moved to the polishing head or the conveying robot from the status where the semiconductor wafer 2 is sucked by the transit mechanism 107 in vacuum, the air supply system 116 supplies air for releasing the semiconductor wafer 2 and the air flows from the wafer sucking openings 112. Water being sucked when the polished semiconductor wafer 2 retains on the sucking surface 10 and mixes with the flowing air, and the air-in-water is sprayed onto a wafer surface on which devices are formed.

The air and the water sprayed onto the wafer surface are charged by the static electricity when passing in pipes connecting to the wafer sucking openings 112 with high speed. For that reason, the static electricity is accumulated in an area on the wafer surface 4 to which the air mixing with the water is sprayed. In a planarization process for an oxidized film on interconnections, this static electricity may destroy an insulation layer on the interconnections. Furthermore, in a process for polishing a surplus of a metal layer embedded in grooves and holes, a metal existing in a dimple may melt because of the electric charge. Since destruction of a gate oxidization film in the semiconductor wafer 2, destruction of an intermediate film in an interconnection layer, and destruction of embedded metal may be caused due to such phenomenon, and the yield ratio of the product may be fallen.

According to an aspect of the present invention, a semiconductor manufacturing apparatus includes: a supporting unit configured to support a semiconductor wafer received from a chemical mechanical polishing apparatus; and a vacuuming system vacuuming to hold the semiconductor wafer on the supporting unit, wherein the vacuuming is applied only in a peripheral area outer than a predetermined radius from a center of the semiconductor wafer.

According to another aspect of the present invention, a semiconductor manufacturing method includes: supporting a semiconductor wafer received from a chemical mechanical polishing apparatus by putting on a supporting member; and holding the semiconductor wafer on the supporting member, wherein the vacuuming is applied only in a peripheral area outer than a predetermined radius from a center of the semiconductor wafer.

By the apparatus or method having such characteristics, when the wafer is released by supplying gas to the vacuumed space, even if static electricity occurs, the electronic circuit to be manufactured on the wafer is not harmed, because the static electricity occurs only in the peripheral area where any circuit does not exist.

According to the present invention, in supporting of a semiconductor by a vacuum chuck, a product can be prevented from being influenced by static electricity.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 4:
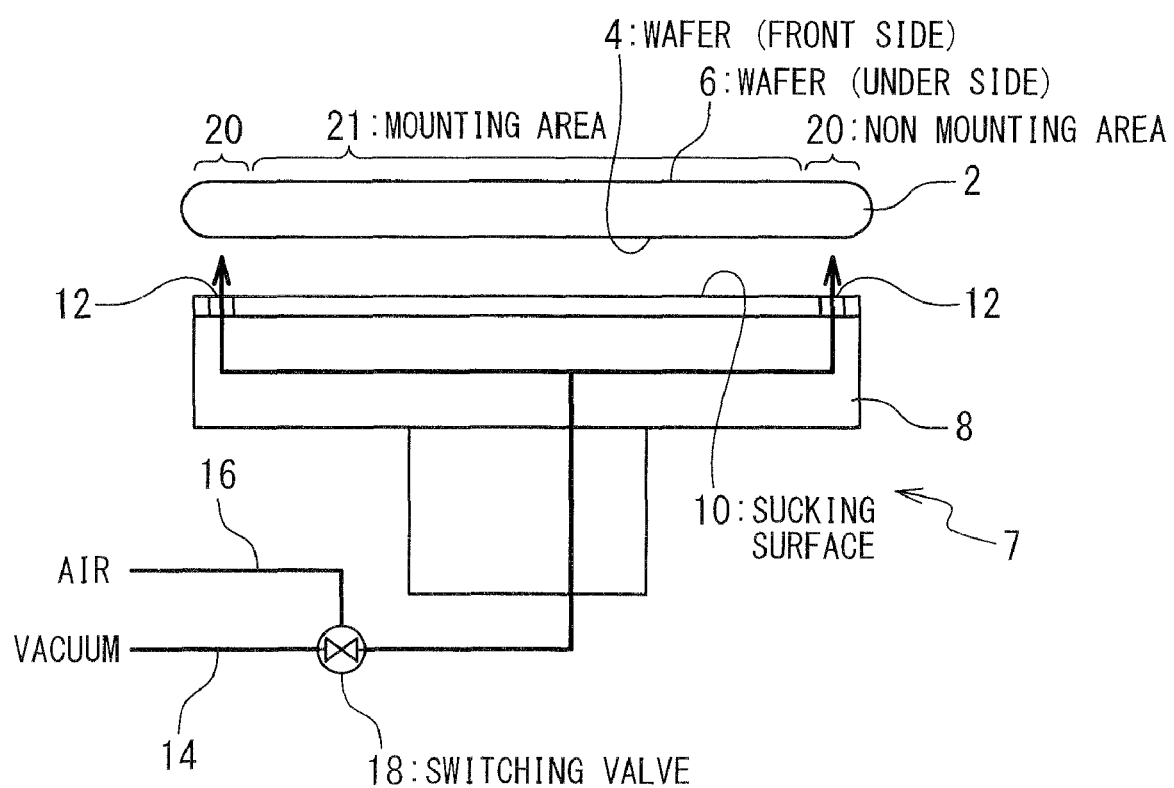
FIG. 4 is a side view of a transit mechanism in a first embodiment.

Referring now to FIG. 4, a side view of a transit mechanism 7 in a first embodiment of the present invention is shown. The transit mechanism 7 includes a supporting unit (which is also called as a supporting member) 8, a vacuuming system 14, a gas supply system 16, and a switching valve 18. The shape of the supporting unit 8 is symmetry of rotation against a central axis parallel with a vertical direction. An upper surface of the supporting unit 8 is a flat sucking surface 10 for supporting the semiconductor wafer 2 horizontally.

Wafer sucking openings 12 are formed in the supporting unit 8 and open on the sucking surface 10. The wafer sucking openings 12 selectively connect to the vacuuming system 14 and the gas supply system 16 via the switching valve 18. When the semiconductor wafer 2 is pressed to the sucking surface 10, the wafer sucking openings 12 is sealed with the wafer 2 and do not connect to the ambient air of the supporting unit 8.

Figure 5:
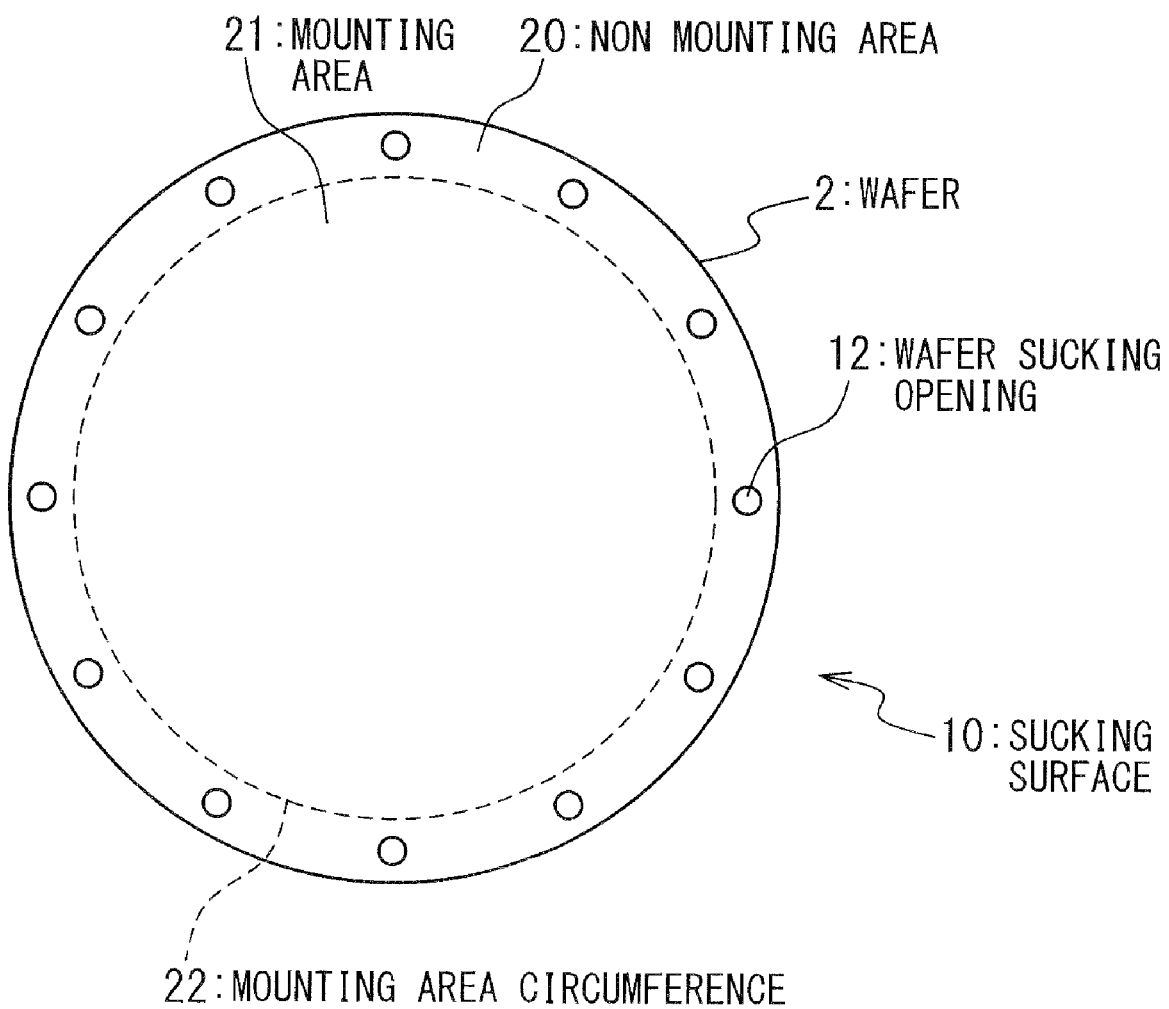
FIG. 5 is a view showing an arrangement of wafer sucking openings of the transit mechanism in the first embodiment.

Referring to FIGS. 4 and 5, the semiconductor wafer 2 includes a non-mounting area 20 and a mounting area 21 other than the non-mounting area 20. An area inside a circle with predetermined radius from a rotation center of the semiconductor wafer 2 is the mounting area 21. A peripheral area of the semiconductor wafer 2 outside the mounting area 21, that is, an area of annulus shape with predetermined width from the outer contour of the wafer 2 is the non-mounting area 20. Electronic circuits such as transistors and interconnections are formed only inside the mounting area 21. No circuit is formed in the non-mounting area 20.

Namely, the mounting area 21 of the semiconductor area 2 indicates an area of the wafer front surface 4 (on which elemental devices such as the transistor, capacitor, etc. are formed) which is made to form product, or an area including a part which is made to form product. The non-mounting area 20 indicates a peripheral area of the wafer front surface 4 which is not made to form product. On the other hand, on the sucking surface 10 of the transit mechanism 7, an area corresponds to the mounting area 21 of the wafer front surface 4 of the semiconductor wafer 2 is called as the mounting area 21, and an area corresponds to the non-mounting area 20 of the wafer front surface 4 is called as the non-mounting area 20. Meanwhile, in FIG. 4, as a matter of convenience for drawing a cross-sectional view, the non-mounting area 20 and the mounting area 21 are indicated at the respective positions on the wafer underside surface 6 corresponding to those in the wafer front surface 4.

The width of the non-mounting area 20 in the direction of the radius of the semiconductor wafer 2 is approximately 2 mm to 3 mm generally. Thus, the peripheral area where the vacuum chuck is applied has a radius 3 mm smaller than that of the semiconductor wafer 2.

All the wafer sucking openings 12 are formed in the non-mounting area 20. That is to say, the wafer sucking openings 12 are formed in line in the area of annulus shape having a width within 3 mm or 2 mm inside from the outer contour of the semiconductor wafer 2. When the wafer surface 4 of the semiconductor wafer 2 and the sucking surface 10 contact with each other on their surfaces, the wafer sucking openings 12 are sealed by the annulus shape area of the wafer 2 and do not connect to the ambient air and the mounting area 21.

Figure 1:
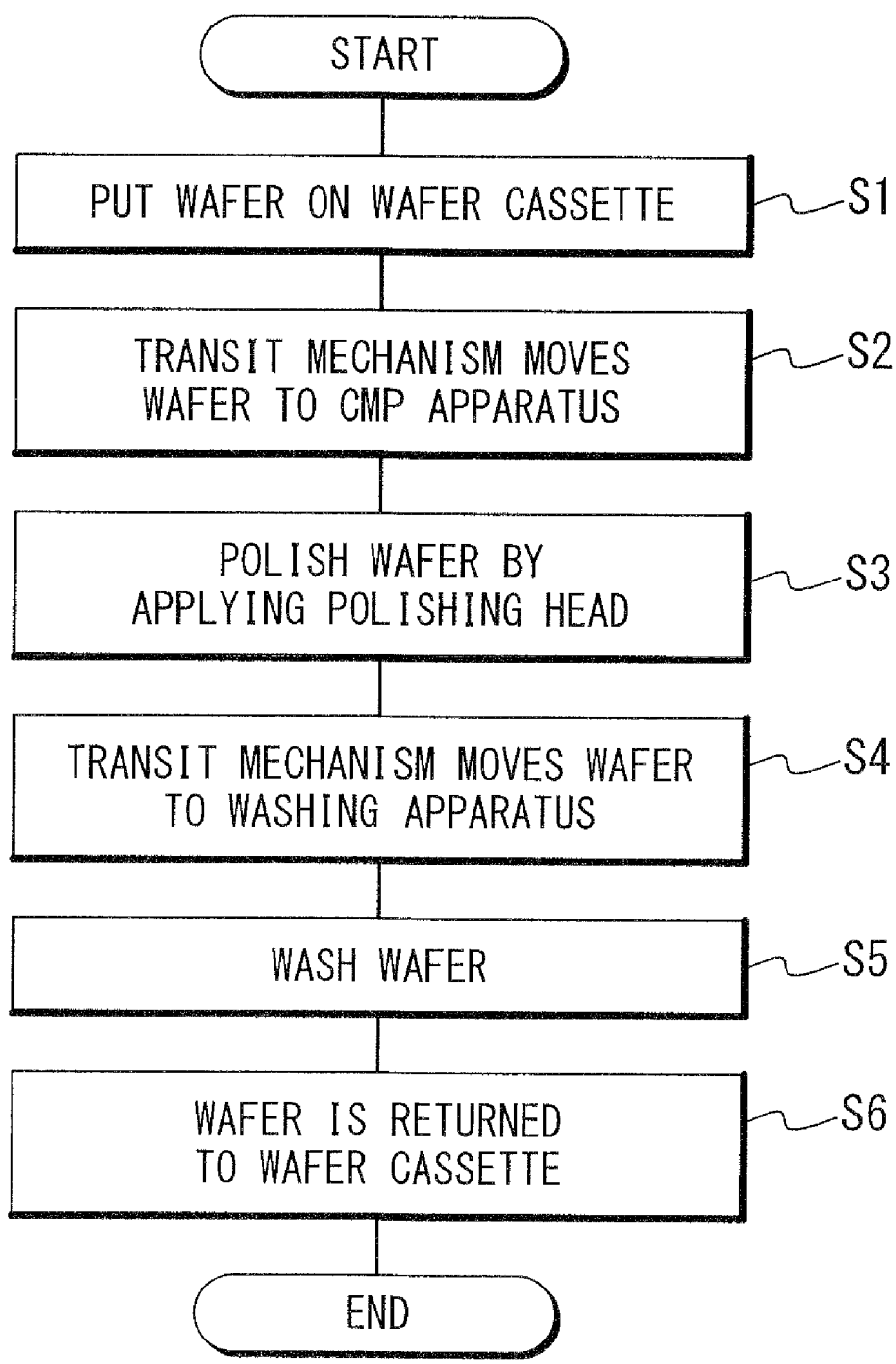
FIG. 1 is a flowchart showing a semiconductor manufacturing process.
Figure 2:
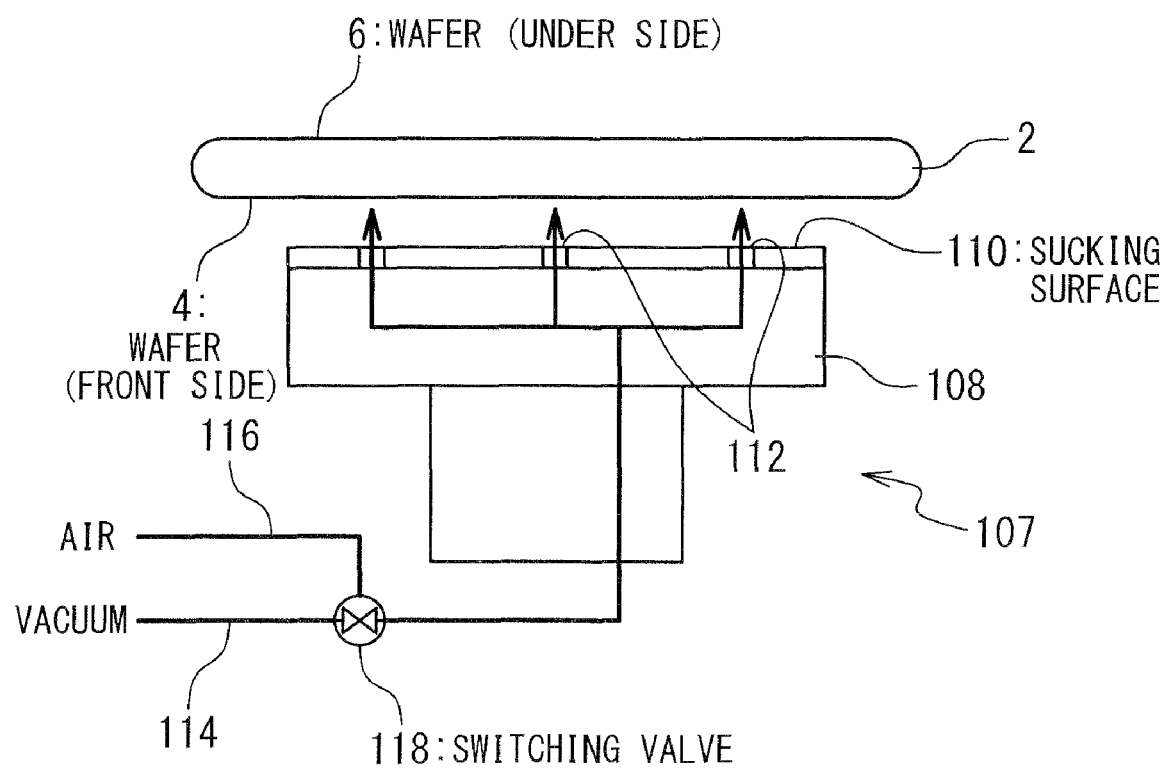
FIG. 2 is a side view of a transit mechanism for conveying a semiconductor wafer.
Figure 3:
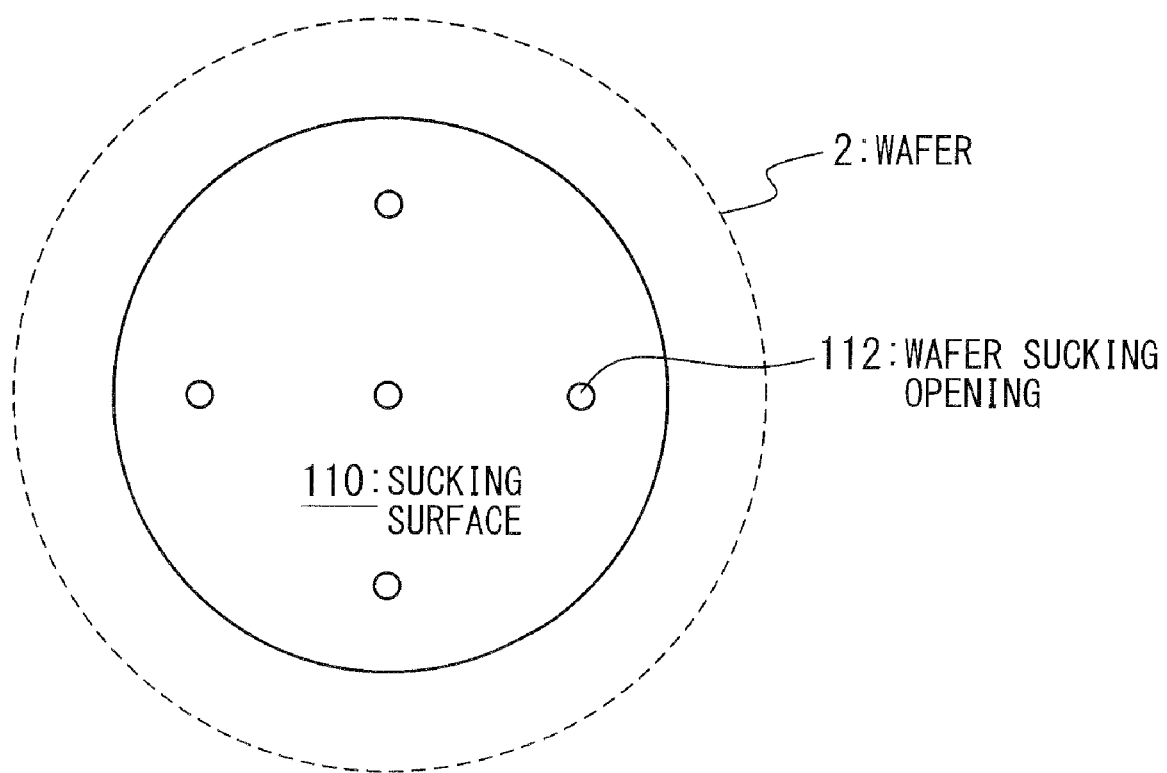
FIG. 3 is a view showing an arrangement of wafer sucking openings of the transit mechanism.

As described above, by using the transit mechanism 7 instead of the transit mechanism 107 of FIG. 1, the process shown in FIG. 1 described in the background art is implemented. In the step S4, the polishing head moves on the semiconductor wafer 2 toward the transit mechanism 7. The semiconductor wafer 2 is released from the transit mechanism to be placed on the sucking surface 10. The supporting unit supports the semiconductor wafer 2 from vertically below.

The switching valve 18 is set so that the wafer sucking openings 12 and the vacuuming system 14 are connected with each other. The vacuuming system 14 implements vacuuming for the wafer sucking openings 12. The semiconductor wafer 2 is held by the vacuum chuck and fixed to the supporting unit 8 with vacuum contact. That is to say, the semiconductor wafer 2 is stably held by being attached firmly to the sucking surface 10 based on a difference in atmospheric pressure between the ambient air and the wafer sucking openings 12.

The transit mechanism 7 moves the semiconductor wafer 2 to a washing apparatus and stops at a predetermined position. The switching valve 18 is set so that the wafer sucking openings 12 and the gas supply system 16 are connected with each other. The gas supply system 16 supplies gas (in general, air) for the wafer sucking openings 12 and the vacuum chuck is released. The semiconductor wafer 2 is detached from the sucking surface 10 and conveyed to the washing apparatus or a wafer cassette. If carbon dioxide is actively added to the air supplied from the gas supply system 16 at this stage, an effect for suppressing static electricity can be achieved.

Even if discharging is caused by static electricity in the vicinity of the wafer sucking openings 12 at this stage, a possibility of causing influence to a product (electronic circuit) function is reduced because the discharging area is the non-mounting area 20.

Figure 6:
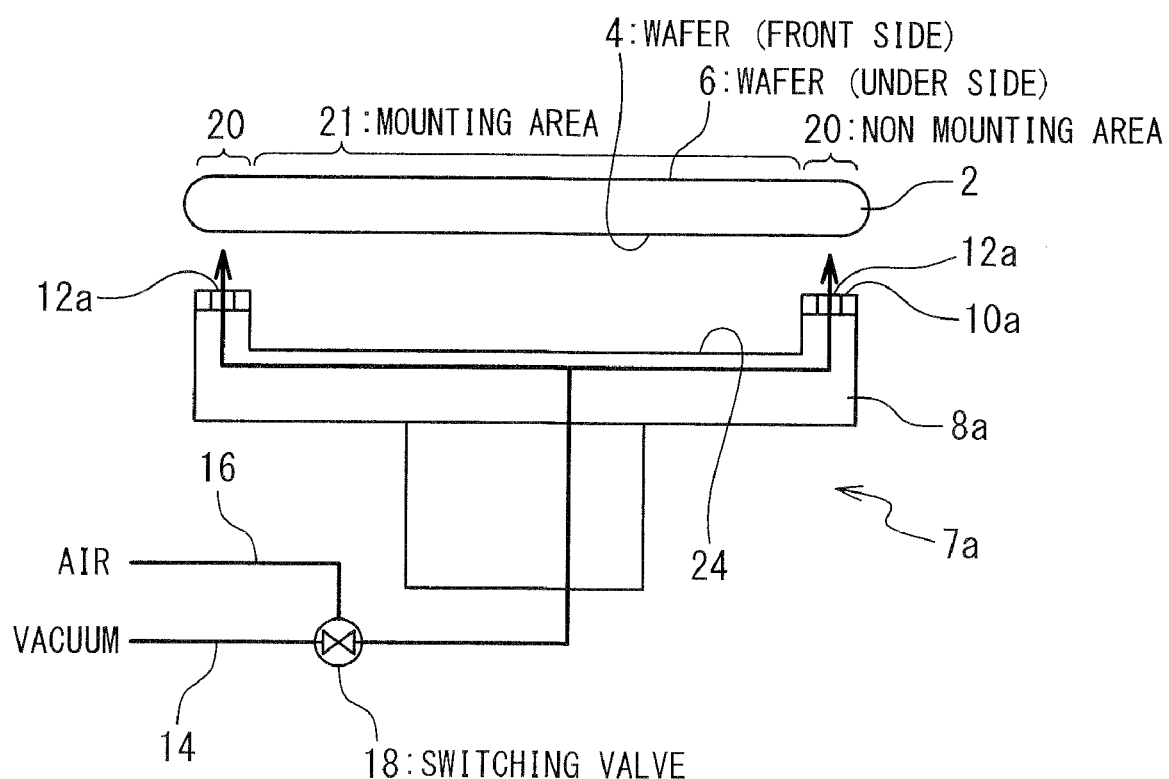
FIG. 6 is a side view of a transit mechanism in a second embodiment.
Figure 7:
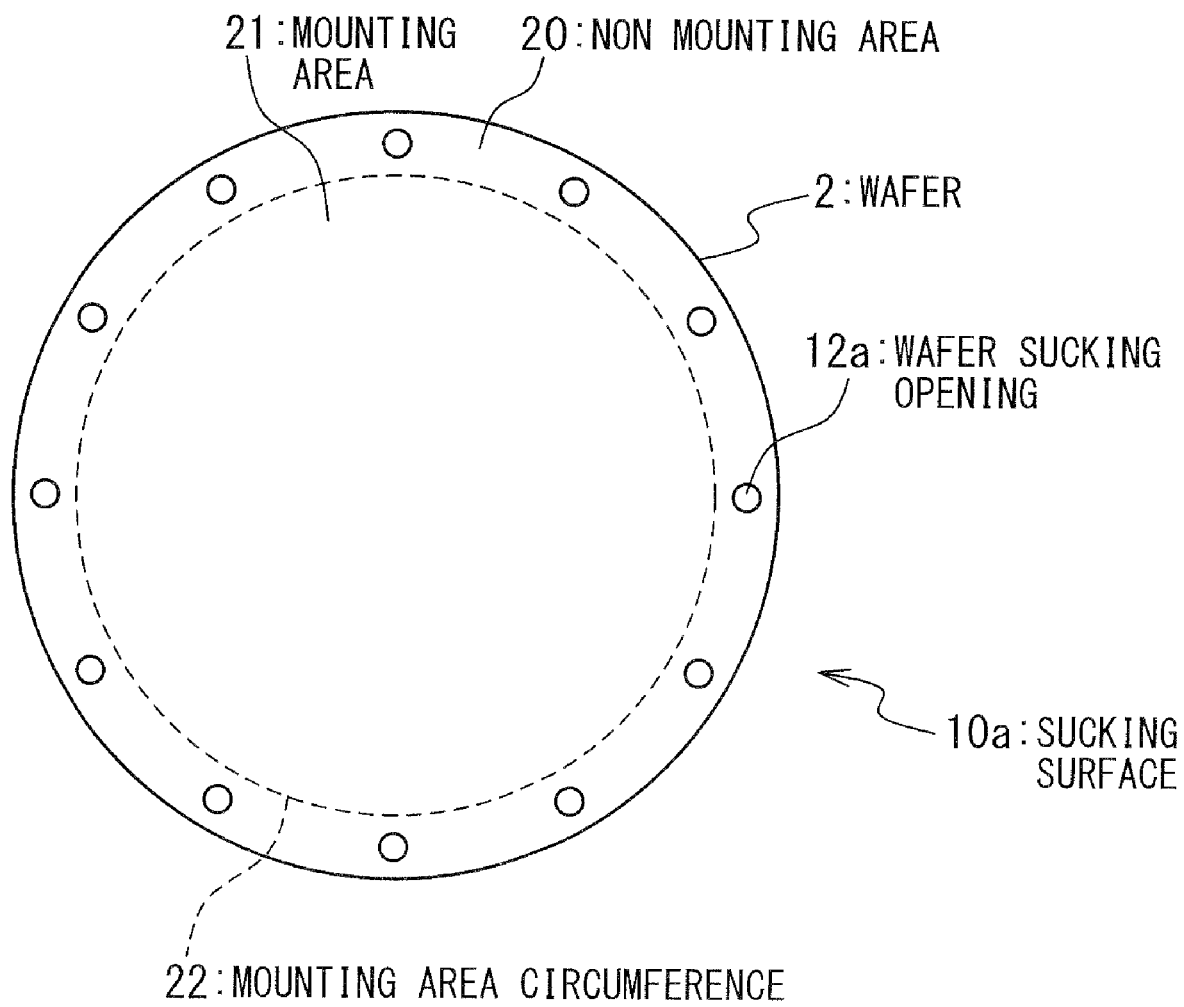
FIG. 7 is a view showing an arrangement of wafer sucking openings of the transit mechanism in the second embodiment.

FIG. 6 is a side view of a transit mechanism in a second embodiment of the present invention. FIG. 7 is a top view of the transit mechanism. A transit mechanism 7a includes a supporting unit 8a, a vacuuming system 14a, a gas supply system 16a, and a switching valve 18a. Compared to the first embodiment, a shape of the sucking surface 10a which is an upper surface of the supporting unit 8a is different. The sucking surface 10a has an annulus shape approximately corresponding to the non-mounting area 20 of the semiconductor wafer 2 placed thereon. Thus, the supporting unit 8a contacts the semiconductor wafer 2 only in the peripheral non-mounting area 20. That is to say, the supporting unit 8a includes a recess hole opening toward a direction of a place of the semiconductor wafer 2 in an area within a predetermined radius from a symmetry axis of rotation of the supporting unit 8a. The wafer sucking openings 12 open on the annulus sucking surface 10a. A relative position of the wafer sucking openings 12 for the semiconductor wafer 2 is the same as that of the first embodiment.

The transit mechanism having such construction operates as similar to the first embodiment. When the semiconductor wafer 2 in wet status after the CMP process is released from the vacuum chuck and detached from the sucking surface 10, the semiconductor wafer 2 can be detached with small force due to small surface tension because the contacting area between the semiconductor wafer 2 and the sucking surface 10 is small in the second embodiment.

It is apparent that the present invention is not limited to the above embodiments, but may be modified and changed without departing from the scope and spirit of the invention.

What is claimed is:

1. A semiconductor manufacturing apparatus, comprising:
    a supporting unit configured to support a semiconductor wafer received from a chemical mechanical polishing apparatus;
    a vacuuming system vacuuming to hold the semiconductor wafer on the supporting unit;
    a gas supply system configured to supply a gas to an area where the vacuuming system draw a vacuum to release the semiconductor wafer held by a vacuum contact from the supporting unit,
    wherein the vacuuming is applied only in a peripheral area outer than a predetermined radius from a center of the semiconductor wafer.

2. The semiconductor manufacturing apparatus according to claim 1, wherein electronic circuits are manufactured on the semiconductor wafer only in an area inner than the predetermined radius.

3. The semiconductor manufacturing apparatus according to claim 1, wherein the supporting unit supports a surface of the semiconductor wafer on which an electronic circuit is to be manufactured from vertically below.

4. The semiconductor manufacturing apparatus according to claim 1, wherein the predetermined radius is 3 mm smaller than a radius of the semiconductor wafer.

5. The semiconductor manufacturing apparatus according to claim 1, wherein the supporting unit contacts the semiconductor wafer only in the peripheral area.

6. The semiconductor manufacturing apparatus according to claim 1, wherein the gas includes carbon dioxide.

7. A semiconductor manufacturing method, comprising:
    supporting a semiconductor wafer received from a chemical mechanical polishing apparatus by putting on a supporting member;
    holding the semiconductor wafer on the supporting member by a vacuum contact; and
    supplying a gas from a gas supply system to release the semiconductor wafer held by the vacuum contact from the supporting unit,
    wherein the vacuum contact is only in a peripheral area outer than a predetermined radius from a center of the semiconductor wafer.

8. The semiconductor manufacturing method according to claim 1, wherein said supporting unit is configured to support said semiconductor wafer along a central inner portion and the peripheral area.

* * * * *